United States Patent [19]

Mueller et al.

[11] Patent Number: 5,039,352
[45] Date of Patent: Aug. 13, 1991

[54] EXTERNAL WALL ELEMENT FOR BUILDINGS

[76] Inventors: Helmut F. O. Mueller, Christian Gau Strasse 45, D-5000 Koeln 41; Joerg Gutjahr, Heideweg 18, D-5223 Nuembrecht, both of Fed. Rep. of Germany

[21] Appl. No.: 530,625

[22] Filed: May 30, 1990

[30] Foreign Application Priority Data

May 30, 1989 [DE] Fed. Rep. of Germany ....... 3917503

[51] Int. Cl.$^5$ ......................................... H01L 31/052
[52] U.S. Cl. .................................... 136/246; 136/259; 126/424; 126/440; 52/173 R; 52/786; 359/19; 359/592; 359/597
[58] Field of Search ................ 136/246, 259; 126/424, 126/440; 350/258, 259, 264; 52/173 R, 788

[56] References Cited

U.S. PATENT DOCUMENTS

| 4,074,704 | 2/1978 | Gellert | 126/440 |
| 4,367,366 | 1/1983 | Bloss et al. | 136/246 |
| 4,418,238 | 11/1983 | Lidorenko et al. | 136/246 |
| 4,644,716 | 2/1987 | Neuroth | 52/173 R |
| 4,863,224 | 9/1989 | Afian et al. | 350/3.7 |

Primary Examiner—Aaron Weisstuch
Attorney, Agent, or Firm—Spensley Horn Jubas & Lubitz

[57] ABSTRACT

The external wall element has an outer pane with lens-like holographic elements. On the inner pane, radiation receiving elements for generating energy are arranged in the focal plane of the holographic elements. The incident light may either by focused on the radiation receiving elements or on translucent portions of the inner pane. The external wall element optionally permits the generation of energy or reflection, transmission of diffuse light being effected in both cases.

13 Claims, 3 Drawing Sheets

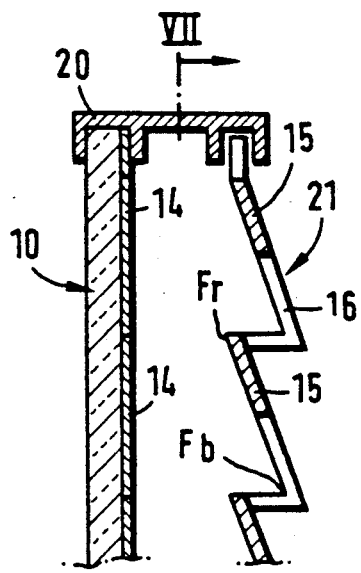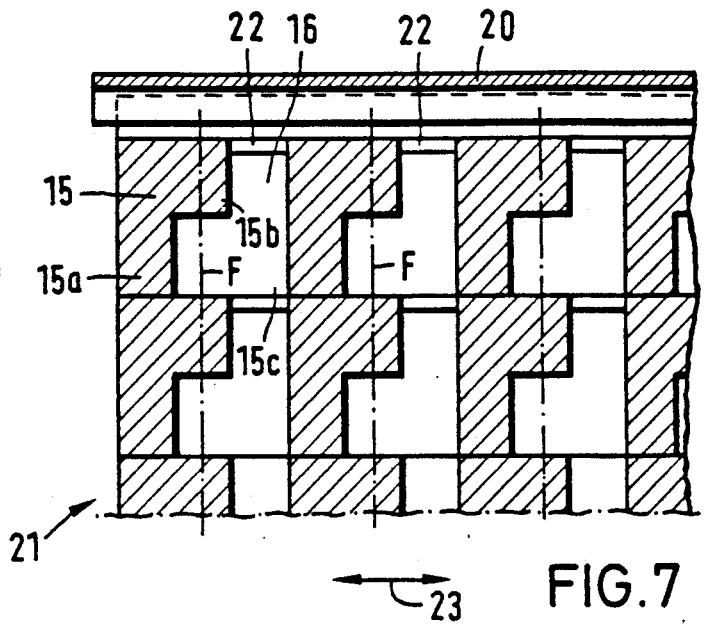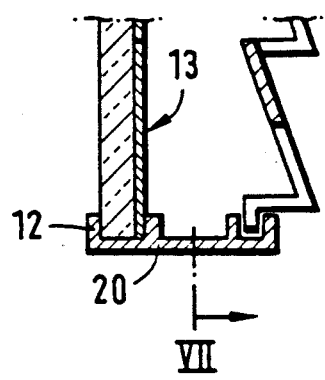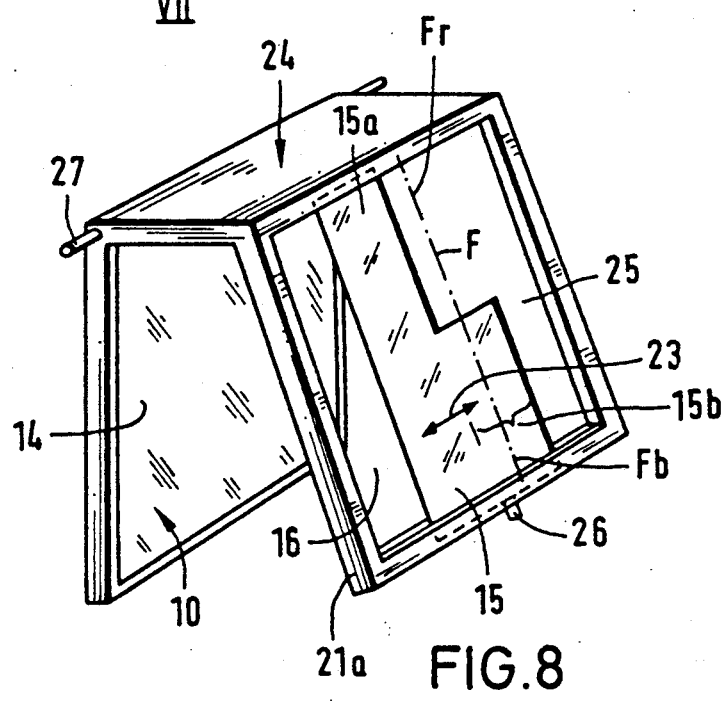

EXTERNAL WALL ELEMENT FOR BUILDINGS

BACKGROUND OF THE INVENTION

1. Field of the Invention

The present invention relates to an external wall element for buildings.

2. Description of Related Art

From German Laid Open 27 52 178, external wall elements are known that have two parallel panes between which solar cells are arranged for generating energy. However, such external wall elements are not translucent. External wall elements are known from German Laid Open 31 25 622 that are provided with a fluorescent pane arranged between two parallel panes. For the purpose of generating energy, photoelectric cells are provided at the rim of the fluorescent pane. This external wall element allows the passage of light however, the energy efficiency of the photoelectric cells is low and what is more, the incident radiation energy passing into a building cannot be regulated. German Laid Open 30 05 914 describes a solar collector having a pane with a plurality of holographic elements arranged side by side. Arrays of solar cells are arranged at a distance behind the holographic elements, which are sensitive to different spectral ranges. The holographic elements focus the radiation of the different wavelengths onto the respective associated solar cells. This solar collector is not designed as an external wall element for buildings and it is not able to transmit light or heat radiation, so that it cannot be used for illumination purposes.

It is an object of the present invention to provide an external wall element for buildings which permits an effective exploitation of the solar radiation for illuminating and heating the building or for energy generation purposes.

SUMMARY OF THE INVENTION

In the external wall element according to the present invention, one pane has at least one radiation-focusing holographic element. A radiation receiving element is arranged behind the holographic element and substantially in the focal plane thereof. The pane and the radiation receiving element are movable relative to one another, so that the incident radiation is alternatively focused onto the radiation receiving element or conducted entirely or partially past the radiation receiving element. This offers the possibility to either transmit radiation into the building or to use the incident radiation entirely or partially for energy generation purposes. The adjustment of the radiation receiving element with respect to the pane is performed either manually by the user or in response to a thermostatic or lighting control of the building.

The radiation receiving elements may either be photoelectric transformers, liquid-operated heat collectors, the inlets of light wave conductors, heat absorbing surfaces or reflectors. In the external wall element, the radiation coming from the sun is concentrated on the radiation receiving elements, whereas diffuse radiation is allowed to pass. Thus, the external wall element allows for the generation of energy, as well as the illumination and heating of rooms with solar energy.

Preferably, the pane is provided with numerous holographic elements, behind each of which a radiation receiving element is arranged. The radiation receiving elements only cover a part of the total area of the pane. They may be arranged on a second pane that is displaceable as a whole behind the first pane. However, there is also the possibility to provide individual interconnected radiation receiving elements, passages or holes being left between adjacent radiation receiving elements.

The portions existing between the radiation receiving elements may be translucent for one part and reflecting for the other, in order to allow the user to change the optical behavior of the external wall element such that energy that is neither exploited for illumination or heating, nor for the generation of electric energy, is reflected and the building is thus kept cool.

The optical elements on the outer pane are holographic lenses. The holograms are present as a diffraction grating in a layer of the outer pane. It is a property of holograms that they deflect incident light directionally selectively. They are produced by superposing two coherent laser beams that impinge from different directions and, due to interference; form a line pattern of the distribution of the light density in the photographic coating of the pane. The impinging laser beams are not modulated by an image. If a hologram disposed on the outer pane is illuminated from the same direction from which one of the hologram-generating beams has come, and if the illumination is effected with the same wavelength as that or the hologram-generating beam, the other hologram-generating beam will be reconstructed. If the illumination is effected with a radiation of another wavelength, the second beam is also reconstructed, but the diffraction angle changes. If such a hologram is illuminated with polychromatic light, e.g. white daylight, it causes a spectral decomposition. This spectral decomposition can be exploited to lead only those wavelengths to the radiation receiving elements that are suited for generating energy and to let the other wavelengths, e.g. those of the visible light, pass. In this manner, it is possible to keep the heat radiation from the inside of the building and to use it for the generation of energy at the same time, while visible light is allowed to pass for illumination purposes.

The pane and the radiation receiving elements are movable relative to one another in order to optionally supply the heat energy to the building or to keep it off. For supplying heat energy to the building, the radiolucent regions not covered by the radiation receiving elements are moved into the focal areas of the optical elements of the pane. However, if it should be desired to keep radiation heat from the building, either the reflecting surfaces or the radiation receiving elements are moved into the focal areas of the holographic elements.

A further movement of the pane and the radiation receiving elements may be provided for a tracking according to the position of the sun, so that the lens-like holographic elements are always oriented with the sun such that the desired regrons of the structure arrar behind coincide with the focal areas of the outer pane.

The outer pane need not be the exterior layer spatially delimiting the external wall element to the outside, but a protective pane may be arranged before the outer pane. In this case, the outer pane is provided movably between the protective pane and the radiation receiving elements. Suitably, a protective pane is also arranged on the inner side of the external wall element that forms the limit or the external wall element to the interior of the building.

The following is a detailed description of embodiments of the invention with respect to the accompanying drawings.

BRIEF DESCRIPTION OF THE DRAWINGS

In the Figures

FIG. 6 is a vertical section of another embodiment of the invention,

FIG. 7 is a section along line VII—VII of FIG. 6,

FIG. 8 is a further embodiment of the invention,

DESCRIPTION OF THE PREFERRED EMBODIMENTS

The external wall element has two parallel panes of glass, namely the outer pane 10 and the inner pane 11. These panes are set in a frame 12 and arranged at a distance of approximately 20 mm. The space between both panes 10 and 11 is empty. This space is sealed dust-tight against the environment. It can either be filled with air or evacuated.

Figure 1:
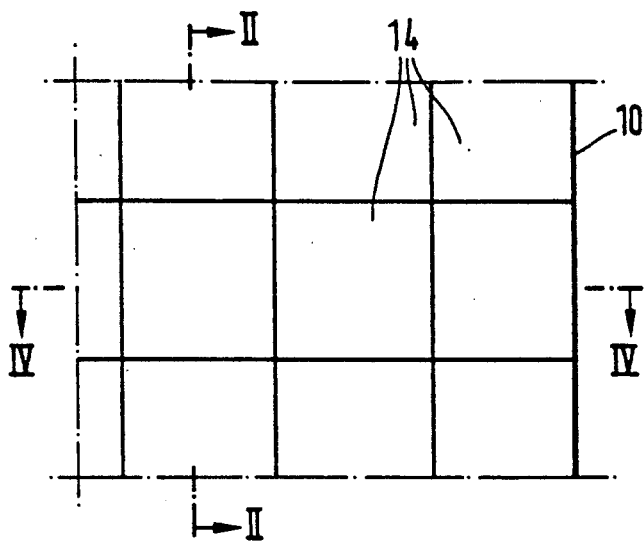
FIG. 1 is a schematic front view of the external wall element divided into optical regions.
Figure 2:
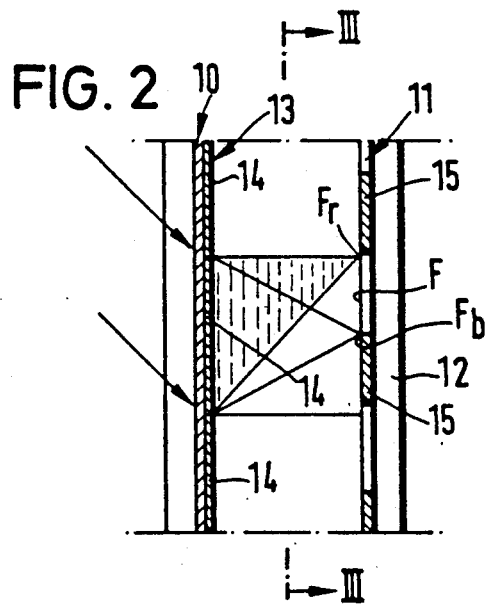
FIG. 2 is a vertical section along line II—II in FIG. 1.
Figure 4:
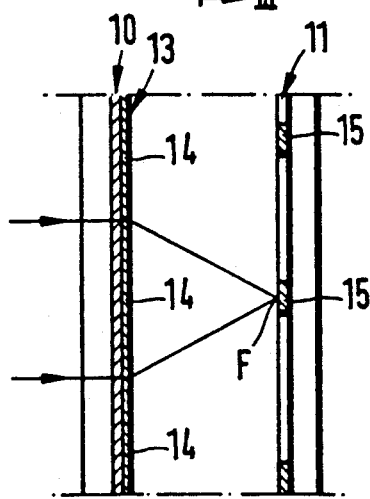
FIG. 4 is a horizontal section along line IV—IV in FIG. 1.

The outer pane 10 has its inner side provided with a coating 13 containing a plurality of holograms. This coating 13 may consist of a photosensitive emulsion or a photo-polymer. A plurality of radiation-focusing holographic elements 14, arranged in a checkered manner, are produced as holograms in the layer 13. These optical elements are holographic lenses, the focal plane of which is selected such that it coincides with the inner side of the inner pane 11 facing the inside of the building. These optical elements 14 cause a line-shaped focusing or the incident radiation along a vertical line, a spectral distribution resulting along the vertical line. FIG. 2 indicates this spectral distribution. The obliquely impinging radiation is focused along the vertical focal line F, the longwave light being vertically deflected more than the short-wave light. The focus of red light is referenced as $F_r$ and the focus of blue light is referenced as $F_b$. As can be taken from FIGS. 2 and 4, a spectral decomposition takes place only in the vertical direction along the focal line F.

Figure 3:
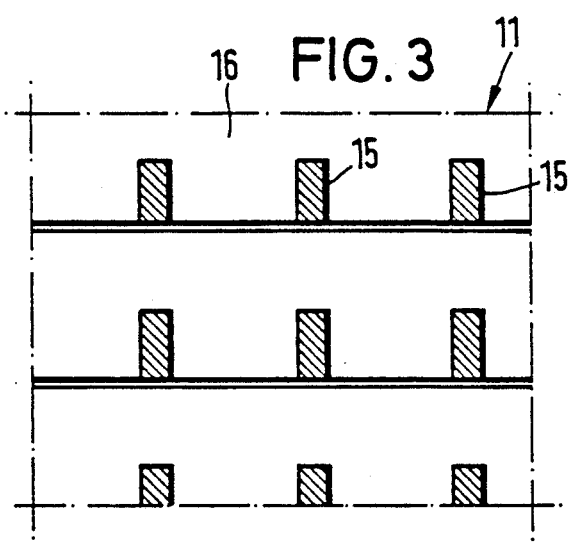
FIG. 3 is a section along line III—III in FIG. 2.

A radiation receiving element 15 is arranged at the inner pane 11 behind each of the radiation collecting holographic elements 14 of the outer pane 10. This radiation receiving element 15 may be a photoelectric transducer, e.g. a solar cell, or the inlet of an array of light wave conductors consisting of one or more beam waveguides. The radiation receiving elements are arranged along the focal line F, but their vertical extension is limited to that region for which they are sensitive. In the present embodiment, this is the lower region of that surface of the inner pane 11 that corresponds to the holographic elements 14. This is evident from FIG. 3 which shows that the radiation receiving elements 15 respectively extend only over a part of a holographic element 14. Since there is a strong focusing in the horizontal direction, the horizontal dimensions or the radiation receiving elements 15 are rather small. The remaining regions 16 that are free of radiation receiving elements 15, are translucent. The radiation receiving elements 15, which are solar cells in the present embodiment, are connected to thin wires that are sunk in the pane 11, in order to carry off the voltage generated by the solar cells. As can be taken from FIG. 3, the radiation receiving elements 15 only consume little of the surface of pane 11. They cover 10% of the surface at most, if they are designed for receiving focused radiation.

In order to follow the course of the sun, a translatory movement of the two panes 10 and 11 relative to one another is provided, both in the vertical and the horizontal directions. In doing so, e.g. the outer pane 10 is moved in such a manner that the radiation receiving elements 15 always receive a maximum of radiation energy.

There is also a possibility to displace the panes 10 and 11 such that the focal line F does not coincide with the radiation receiving elements 15 so that the entire heat radiation is supplied to the building through the pane 11. Thus, the user can decide, whether the solar energy is to be used to illuminate or to heat the building or to generate electric power.

Figure 5:
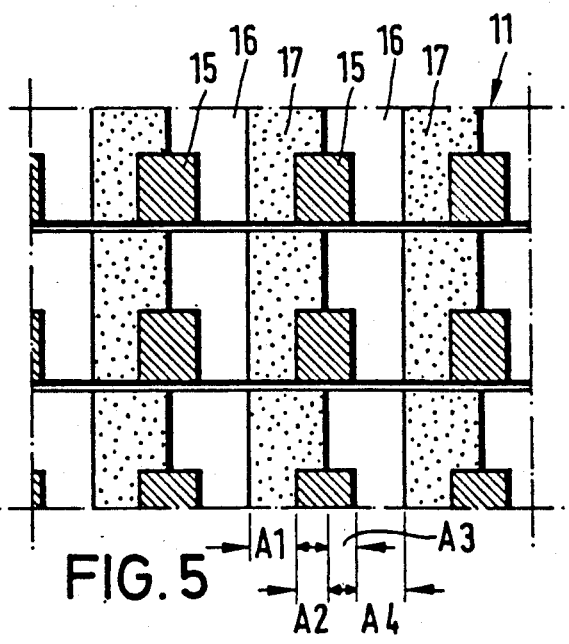
FIG. 5 is another embodiment, illustrated as in FIG. 3.

The embodiment depicted in FIG. 5 corresponds to the first embodiment and differs only in that the inner pane 11 has reflecting portions 17 besides the transparent portions 16. The transparent portions 16 and the reflecting portions 17 are of the same size and they are arranged symmetrically about the radiation receiving element 15. This results in the regions A1, A2, A3, and A4 shown in FIG. 5. In the region A1, the surface element is reflecting over its entire height. One part of region A2 is occupied by the radiation receiving element and another part is occupied by the reflecting surface 17. One part or region A3 is occupied by the radiation receiving element and another part is occupied by the transparent surface 16. The entire height of region A4 is formed by a transparent surface 16. By horizontally displacing the pane 10, the user can decide in which of the regions A1 to A4 the focal line F will fall. In this way, the physical behavior of the external wall element can be changed according to the user's liking. In the region A1, the external wall element is reflecting, in region A2 reflection and power generation is effected, in region A3 light can pass and power is generated, and in region A4 there is only light transmittance. Beam waveguides may be implemented instead of solar cells. The reflecting layer of the portions 17 is applied in the form of a di-electric coating of metal oxide. Also the conductive paths for the connection of the radiation receiving elements may be provided as conductive layers on pane 11.

If there is an exact tracking according to the position of the sun, the radiation receiving elements 15 (and possibly the reflecting surfaces 17) need only be very small, since the holographic lenses effect a strong focusing of the radiation. This results in large transmitting surfaces 16 that let diffuse incident light pass.

In the embodiment of FIGS. 6 and 7, the pane 10 having the coating 13 in which the holographic elements 14 are provided is fixedly mounted within a frame 20. A supporting structure 21 is arranged within the frame 20 for horizontal displacement together with the radiation receiving elements 15. The supporting structure 21 is substantially saw-toothed in shape, since in holographic focusing, the focal line F does not extend in parallel to the hologram, but the focus $F_r$ of the long wavelength (red) light rather has a smaller distance to the hologram than the focus $F_b$ of the short wavelength (blue) light. The oblique arrangement of the reception fields ensures that every reception field follows the course of the focal line. Thus, the radiation receiving elements 15 extend in an acute angle relative to the pane 10—seen in vertical section.

In a vertical strip 15a, corresponding to approximately a third of the width of a reception field or a holographic element 14, each radiation receiving element 15 extends over the entire height of the reception field. In an adjacent strip 15b, corresponding only to a part of receiving element extends only over the upper part of the height of the reception element, and in a further strip 15c, the free area 16 covers the entire height of the reception field. All radiation receiving elements 15 are interconnected in the vertical direction and, in the horizontal direction, the regions between two adjacent radiation receiving elements 15 are connected by connecting elements 22. All radiation receiving elements 15 thus form a uniform supporting structure 21 that is displaceable as a whole in parallel relative to the pane 10, while maintaining the distance to the pane 10, as indicated by the bidirectional arrow 23 in FIG. 7.

Displacing the supporting structure 21 relative to the pane 10 will bring either the strips 15a or the strips 15b or the strips 15c being translucent over their entire height to coincide with the focal lines F. If the strips 15a are adjusted to coincide with the focal lines F, the entire incident and focused energy is conducted onto the radiation receiving elements 15, so that no radiation will get into the building. If, in the present embodiment, the strips 15b are adjusted to coincide with the focal lines F, only the long wavelength radiation will be transformed into energy or be kept from the building, respectively, whereas the short wavelength radiation is allowed to pass. However, if the entire height of the region 16 is brought to coincide with the focal lines F, the entire radiation will be allowed to penetrate into the building.

A suitable configuration of the free region 16 may allow to selectively transmit only radiation of a predetermined wavelength range. In this manner, the color of the light allowed to enter the building may be chosen.

The free regions 16 may be made of translucent glass or may simply be holes.

It is also possible to provide the transition between the strips 15a, 15b and 15c not in a stepped fashion, but in a continuous manner by an oblique border line of the radiation receiving elements 15. In this way, the ratio and the amount to the transmitted light may be changed continuously.

Finally, there also is the possibility to move the pane 10 and the supporting structure 21 relative to one another in the vertical direction in order to obtain different colors of the light falling into the building. Whereas a horizontal relative movement will change the amount of transmitted light, thus achieving a dimming effect, a vertical relative movement changes the color of the light.

The embodiment of FIG. 8 has a frame 24, supporting the vertical pane 10, with a single holographic element 14. Behind the pane 10, the frame 24 has a supporting structure 21a in which the radiation element 15 is arranged so as to be horizontally displaceable (bidirectional arrow 23). The radiation receiving element 15 is located in the window 25 of the supporting structure 21a and may be moved such that either its region 15a or its region 15b coincide with the focal line F of the holographic element 14 or that the radiation receiving element 15 does not coincide with the focal line F at all. A horizontal movement of the radiation receiving element 15 is performed by a (non-illustrated) adjusting mechanism that engages at a pin 26 of the radiation receiving element 15.

The frame 24 is pivotable around a horizontal axis 27 for tracking the height of the sun.

Figure 9:
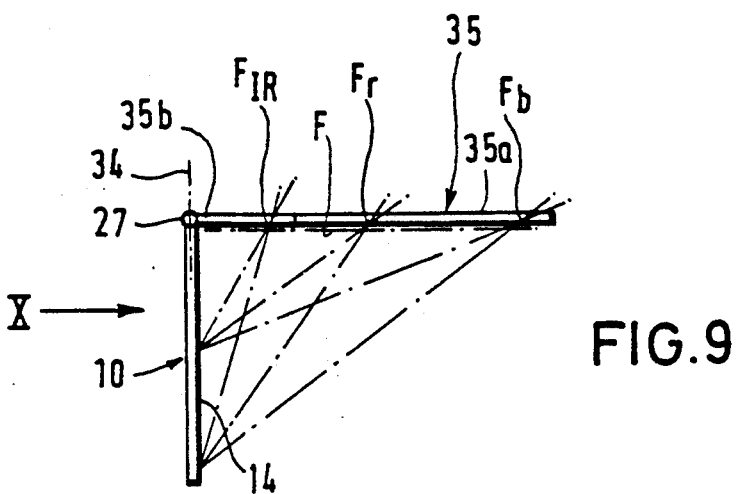
FIG. 9 is a side elevational view of a further embodiment of the invention.
Figure 10:
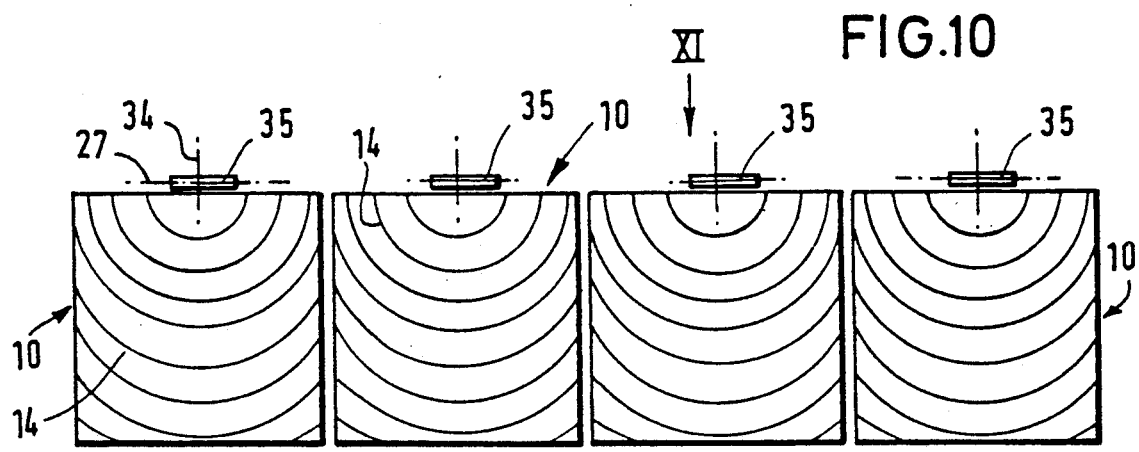
FIG. 10 is a view of FIG. 9, seen in the direction of the arrow X.
Figure 11:
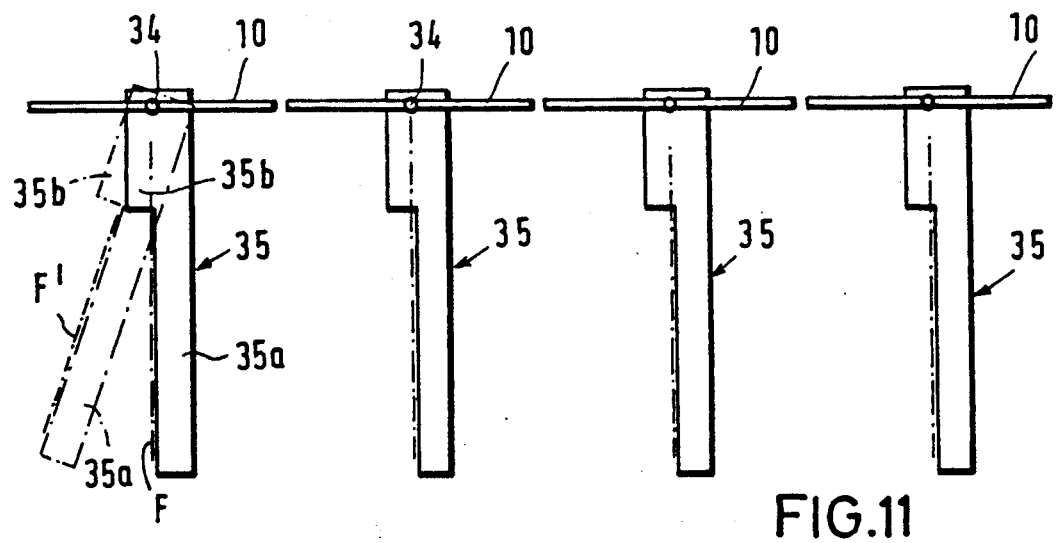
FIG. 11 is a view of FIG. 10, seen in the direction of the arrow XI.

FIGS. 9 to 11 illustrate an embodiment in which a plurality of panes 10, each having a holographic element 14, are arranged in parallel. Either pane 10 is pivotable about a vertical central axis 34 so that a tracking of the panes 10 corresponding to the angle of elevation of the sun is possible. A blind 35, configured as a strip or a bar, projects from the upper end of each pane 10. The holographic elements 14 are designed such that the focal line F extends substantially rectangularly to the pane 10, as can be seen in FIG. 9. The blind 35 is arranged along the focal line F. This blind is opaque and, preferably, radiation absorbing so that it can receive the radiation incident from the sun and concentrated by the holographic element 14 along the focal line F.

The blind 35 may be pivoted about the vertical axis 34 relative to the pane 10, as indicated by broken lines in FIG. 11. In this case, the incident radiation is not shaded along the focal line F and is allowed to pass into the building.

If the position of the sun changes in the azimuth, the focal line F will turn about the axis 34, e.g. to take the position F'. The blind is adapted to keep track of the azimuth angle such that the position of the blind relative to the focal line remains the same.

Each blind 35 consists of an elongate strip 35a that may shield the entire length of the focal line F, and of a short strip 35b that only screens off the infrared focus $F_{IR}$, while transmitting the visible light. Selectively, either the region 35a or the region 35b can be set to the focal line F, or the blind 35 is pivoted to such an extent that it leaves the focal line F entirely free.

What is claimed is:

1. An external wall element, comprising:
    a pane having a holographic element for focusing radiation incident upon the pane, the holographic element defining a surface and a focal plane,
    a radiation receiving element spaced a distance from the holographic element and substantially in the focal plane of the holographic element, the radiation receiving element defining a surface which is smaller than the surface of the holographic element, the pane and the radiation receiving element being movable relative to one another,
    whereby a variable amount of radiation incident upon the pane may be focused upon the radiation receiving element and a variable amount of radiation incident upon the pane may be conducted past the radiation receiving element.

2. The external wall element according to claim 1, wherein the pane has a plurality of radiation-focusing holographic elements, and further comprising:
    a supporting structure spaced a substantially constant distance from the pane, the supporting structure having a plurality of radiation receiving elements, the pane and the supporting structure being moveable relative to one another.

3. The external wall element according to claim 2, wherein the pane and the supporting structure are oriented substantially vertically and are horizontally moveable relative to one another.

4. The external wall element according to claim 1, wherein the pane and the radiation receiving element are pivotable about a substantially horizontal axis.

5. The external well element according to claim 1, wherein the radiation receiving element defines a horizontal region and wherein the pane and the radiation receiving element are vertically movable relative to one another, whereby relative vertical movement between the pane and the radiation receiving element enables radiation incident upon the pane to be constantly focused upon the horizontal region of the radiation receiving element.

6. The external wall element according to claim 1, comprising a reflecting region substantially adjacent the radiation receiving element, whereby a variable amount of radiation incident upon the pane may be focused upon the reflecting region.

7. The external wall element according to claim 1, wherein the radiation incident upon the pane comprises a spectrum, wherein the holographic element decomposes the spectrum, and wherein the radiation receiving element is arranged such that a part of the spectrum is received by the radiation receiving element and a part of the spectrum is conducted past the radiation receiving element.

8. The external wall element according to claim 7, wherein the pane and the radiation receiving element are vertically moveable relative to one another, whereby relative vertical movement between the pane and the radiation receiving element enables the part of the spectrum conducted past the radiation receiving element to be varied.

9. The external well element according to claim 1, wherein the amount of radiation focused upon the radiation receiving element and the amount of radiation conducted past the radiation receiving element define a ratio, and wherein the pane and the radiation receiving element are horizontally moveable relative to one another, whereby relative horizontal movement between the pane and the radiation receiving element enables the ratio to be varied to thereby obtain a dimming effect.

10. The external wall element according to claim 1, wherein the radiation receiving element comprises a photoelectric transducer.

11. The external wall element according to claim 1, wherein the radiation receiving element defines a vertical region and wherein the pane and the radiation receiving element are horizontally movable relative to one another, whereby relative horizontal movement between the pane and the radiation receiving element enables radiation incident upon the pane to be constantly focused on the vertical region of the radiation receiving element.

12. The external wall element according to claim 1, wherein the holographic element defines a spectral focal line and wherein the radiation receiving element extends at an acute angle with respect to the pane, the acute angle and the spectral focal line being substantially coincident.

13. The external wall element according to claim 1, wherein the radiation receiving element comprises a light wave conductor.

* * * * *